US010551439B2

(12) United States Patent
Drouin et al.

(10) Patent No.: US 10,551,439 B2
(45) Date of Patent: Feb. 4, 2020

(54) SYSTEMS FOR DIAGNOSTIC CIRCUIT TESTING

(71) Applicant: Allegro MicroSystems, LLC, Worcester, MA (US)

(72) Inventors: Mathew Drouin, Manchester, NH (US); Jonathan Zimmermann, Bedford, NH (US)

(73) Assignee: Allegro MicroSystems, LLC, Manchester, MA (US)

( * ) Notice: Subject to any disclaimer, the term of this patent is extended or adjusted under 35 U.S.C. 154(b) by 277 days.

(21) Appl. No.: 15/657,324

(22) Filed: Jul. 24, 2017

(65) Prior Publication Data

US 2019/0025374 A1 Jan. 24, 2019

(51) Int. Cl.
*G01R 31/319* (2006.01)
*G01R 31/28* (2006.01)
*G01R 31/30* (2006.01)
*G01R 35/00* (2006.01)

(52) U.S. Cl.
CPC ... *G01R 31/31926* (2013.01); *G01R 31/2884* (2013.01); *G01R 31/3004* (2013.01); *G01R 31/31905* (2013.01); *G01R 31/31924* (2013.01); *G01R 35/005* (2013.01)

(58) Field of Classification Search
CPC combination set(s) only.
See application file for complete search history.

(56) References Cited

U.S. PATENT DOCUMENTS

| 5,570,012 A * | 10/1996 | Orense | G01R 15/12 324/762.01 |
| 6,653,827 B2 * | 11/2003 | Gaither | G01R 31/2884 324/750.3 |
| 6,681,361 B1 * | 1/2004 | Nakano | G01R 31/2851 324/759.03 |
| 2010/0207649 A1 * | 8/2010 | Krishnan | G01R 31/026 324/762.02 |
| 2016/0041217 A1 * | 2/2016 | Lee | G01R 31/021 702/58 |

* cited by examiner

Primary Examiner — Jay Patidar
(74) Attorney, Agent, or Firm — Daly, Crowley, Mofford & Durkee LLP

(57) ABSTRACT

An integrated circuit including a first multiplexor configured to receive one of a plurality of diagnostic signals from circuitry under test (DUT), the first multiplexor responsive to diagnostic signals provided thereto and configured to selectively output one of the diagnostic signals in response to a control signal, a second multiplexor configured to receive one of a plurality of reference signals from one of a plurality of nodes on a reference circuit, the second multiplexor configured to selectively output one of the diagnostic signals in response to a control signal, and a comparator configured to compare the diagnostic signal elicited from the first multiplexor with the reference signal elicited from the second multiplexor, the comparator further configured to output the result of the comparison between the diagnostic signal and the reference signal.

26 Claims, 6 Drawing Sheets

SYSTEMS FOR DIAGNOSTIC CIRCUIT TESTING

BACKGROUND

As circuit geometries become smaller and more complex, signal speeds become faster, and modular substitution of IC components become common, diagnostic and safety testing becomes more challenging. Automatic Test Equipment (ATE), for example, including integrated ATE systems, are used to generate signals to exercise and test a circuit or system. The resulting generated signals may be analyzed by the ATE and/or external test equipment. ATEs often require adaptation to a particular Device Under Test (DUT) within a particular integrated circuit (IC). The ATE-generated test signals may include a plurality of fixed reference sources for each of, for example, fixed thresholds (e.g., minimum or maximum thresholds) for a plurality of signal tests.

FIG. 1 shows a prior art system for testing a single diagnostic analog signal 12' in which nodes 5a' and 5b' along a resistor string 10' of resistors 10a'-10c' deliver fixed reference/threshold output voltages 14a' and 14b' that are compared to diagnostic signal 12'. The diagnostic signal 12' is compared to reference signals 14a' and 16b' at comparators 20 and 22 respectively. A diagnostic signal that falls outside either of the reference signals 14a' or 14b' will result in positive fault signals 20a' or 22a', and a subsequent positive fault signal 24' from OR gate 24.

If the components of FIG. 1 were to be replicated for each diagnostic test, manufacture of such a system can become unwieldly if a DUT requires many tests or the tests need to be modified to adapt to changing or substituted circuitry.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide an integrated circuit including dynamically configurable and programmable diagnostic test circuits for testing signals from DUTs integrated therewith.

In an aspect, an integrated circuit is provided including a reference circuit configured to provide a plurality of reference signals, a first circuit having a first plurality of inputs with at least some of the first plurality of inputs configured to receive a corresponding one of a second plurality of diagnostic signals from circuitry under test, wherein in response to a control signal provided to an input thereof, the first circuit configured to provide at an output thereof a selected one of the diagnostic signals on the first plurality of inputs, a second circuit having a third plurality of inputs with each of the third plurality of inputs coupled to said reference circuit with at least some of the third plurality of inputs configured to receive corresponding ones of the plurality of reference signals from said reference circuit and wherein, in response to a control signal provided thereto, the second circuit configured to provide at an output thereof a selected one of the reference signals, and a comparator having a first input coupled to the output of said first circuit and having a second input coupled to the output of said second circuit such that in response to diagnostic and reference signals provided thereto from said first and second circuits, said comparator compares the diagnostic and reference signals and provides a state signal at an output thereof, with the state signal representing a result of the comparison between the diagnostic signal and the reference signal.

In an embodiment, the first circuit is configured to receive input signals and forward a selected input signal on a selected input into a single line.

In an embodiment, the first circuit is a multiplexor having a plurality of input signal paths and a single output signal path.

In an embodiment, the first circuit is provided as a multi-input, single output switch.

In an embodiment, the reference circuit is provided having a plurality of nodes with each node having one of the plurality of reference signals provided thereon.

In an embodiment, the second circuit is coupled to said reference circuit and configured to receive respective ones of the plurality of reference signals at corresponding inputs thereof from respective ones of a plurality of nodes on the reference circuit, the second circuit configured to selectively output one of the reference signals in response to a control signal provided thereto.

In an embodiment, a controller is connected to the first and second multiplexor, the controller configured to a) transmit a first control signal to the first multiplexor so as to selectively elicit one of the diagnostic signals from the first multiplexor, b) transmit a second control signal to the second multiplexor so as to selectively elicit one of the reference signals from the second multiplexor, c) receive the result of the comparison between the diagnostic signal and the reference signal, and d) output a fault signal if the difference between the diagnostic signal and the reference signal exceeds a predetermined threshold.

In an embodiment, the controller is further configured to repeat a) through d) with a series of paired diagnostic and reference signals. In an embodiment, every other one of the pairs of diagnostic and reference signals corresponds to a diagnostic test of the circuit sensor output.

In an embodiment, the diagnostic test of the circuit sensor output includes testing a plurality of pulses of different current from the sensor output.

In an embodiment, the reference circuit includes a plurality of resistors separating the plurality of nodes from one another, the resistors configured to provide a different reference voltage level at each of the nodes.

In an embodiment, the circuitry under test includes a magnetic field sensing element and wherein the diagnostic signals from the circuitry under test include signals representing magnetic variations sensed by the magnetic field sensing element. In an embodiment, the magnetic field sensing element includes a Hall element.

In an embodiment, the magnetic field sensing element includes a magnetoresistive (MR) sensing element. In an embodiment, the MR element is at least one of an Anisotropic MR, Giant MR, or Tunnel MR sensing element.

The integrated circuit of claim 1 wherein the circuitry under test includes at least one of a speed sensor, direction sensor, or linear magnetic field sensor.

In an aspect of described embodiments, an integrated circuit includes a first multiplexor configured to receive one of a plurality of diagnostic signals from circuitry under test (DUT), the first multiplexor responsive to diagnostic signals provided thereto and configured to selectively output one of the diagnostic signals in response to a control signal, a second multiplexor configured to receive one of a plurality of reference signals from one of a plurality of nodes on a reference circuit, the second multiplexor configured to selectively output one of the diagnostic signals in response to a control signal, and a comparator configured to compare the diagnostic signal elicited from the first multiplexor with the reference signal elicited from the second multiplexor, the comparator further configured to output the result of the comparison between the diagnostic signal and the reference signal, wherein the first circuit is a multiplexor having a plurality of input signal paths and a single output signal path, and wherein the first circuit is provided as a multi-input, single output switch.

In an embodiment, the integrated circuit further includes a controller connected to the first and second multiplexor, the controller configured to: a) transmit a first control signal to the first multiplexor so as to selectively elicit one of the diagnostic signals from the first multiplexor, b) transmit a second control signal to the second multiplexor so as to selectively elicit one of the reference signals from the second multiplexor, c) receive the result of the comparison between the diagnostic signal and the reference signal, and d) output a fault signal if the difference between the diagnostic signal and the reference signal exceeds a predetermined threshold.

In an embodiment, the controller is further configured to repeat a) through d) with a series of paired diagnostic and reference signals.

In an embodiment, every other one of the pairs of diagnostic and reference signals corresponds to a diagnostic test of the circuit sensor output.

In an embodiment, the diagnostic test of the circuit sensor output includes testing a plurality of pulses of different current from the sensor output.

In an embodiment, the reference circuit includes a plurality of resistors separating the plurality of nodes from one another, the resistors configured to provide a different reference voltage level at each of the nodes.

In an aspect of described embodiments, an integrated circuit includes reference circuit means for providing a plurality of reference analog signals, means for receiving a plurality of diagnostic analog signals from circuitry under test, means for comparing any of said plurality of reference analog signals with any of said plurality of analog diagnostic signals, and means for providing an output representing the state of the comparison between the plurality of reference signals and plurality of diagnostic signals.

In an embodiment, the reference circuit means includes means for selecting any one of the reference analog signals and forwarding the selected any one of the reference analog signals into a single line, the means for receiving a plurality of diagnostic analog signals from circuitry under test including means for selecting any one the plurality of reference analog signals and forwarding the selected any one of the reference analog signals into a single line, and the means for providing an output representing the state of the comparison includes a single output line.

In an embodiment, the integrated circuit further includes means of testing the output of the integrated circuit.

In an aspect of described embodiments, a circuit includes reference signal means for providing a plurality of analog reference signals, first selecting means for receiving one or more analog diagnostic signals from circuitry under test, wherein in response to a control signal provided to an input thereof, the selecting means provides at one or more outputs thereof a selected one of the analog diagnostic signals, second selecting means, coupled to said reference circuit, for receiving corresponding ones of the plurality of reference signals from said reference signal means wherein, in response to a control signal provided thereto, the second selecting means provides at an output thereof, a selected one of the reference signals, and comparing means, coupled to the outputs of said first and second means for selecting, the comparing means for comparing diagnostic and reference signals provided thereto from said first and second means for selecting and in response to the comparing for providing a state signal at an output thereof.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features. Furthermore, the drawings are not necessarily to scale, emphasis instead being placed on the concepts disclosed herein.

DETAILED DESCRIPTION

Described embodiments are directed to integrated circuits having dynamically configurable diagnostic test circuits.

Figure 1:
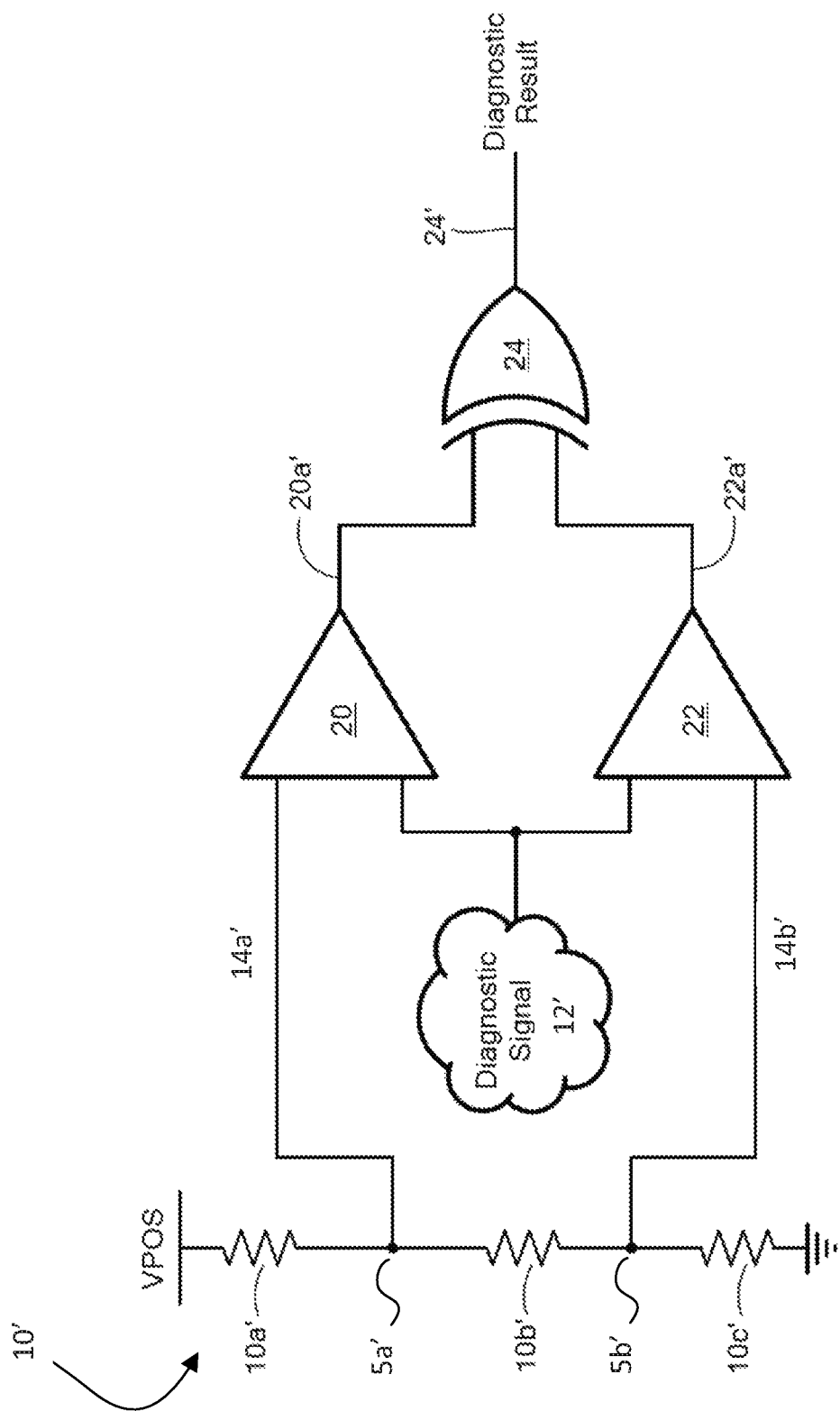
FIG. 1 is a bock diagram of a prior art diagnostic test circuit.
Figure 1A:
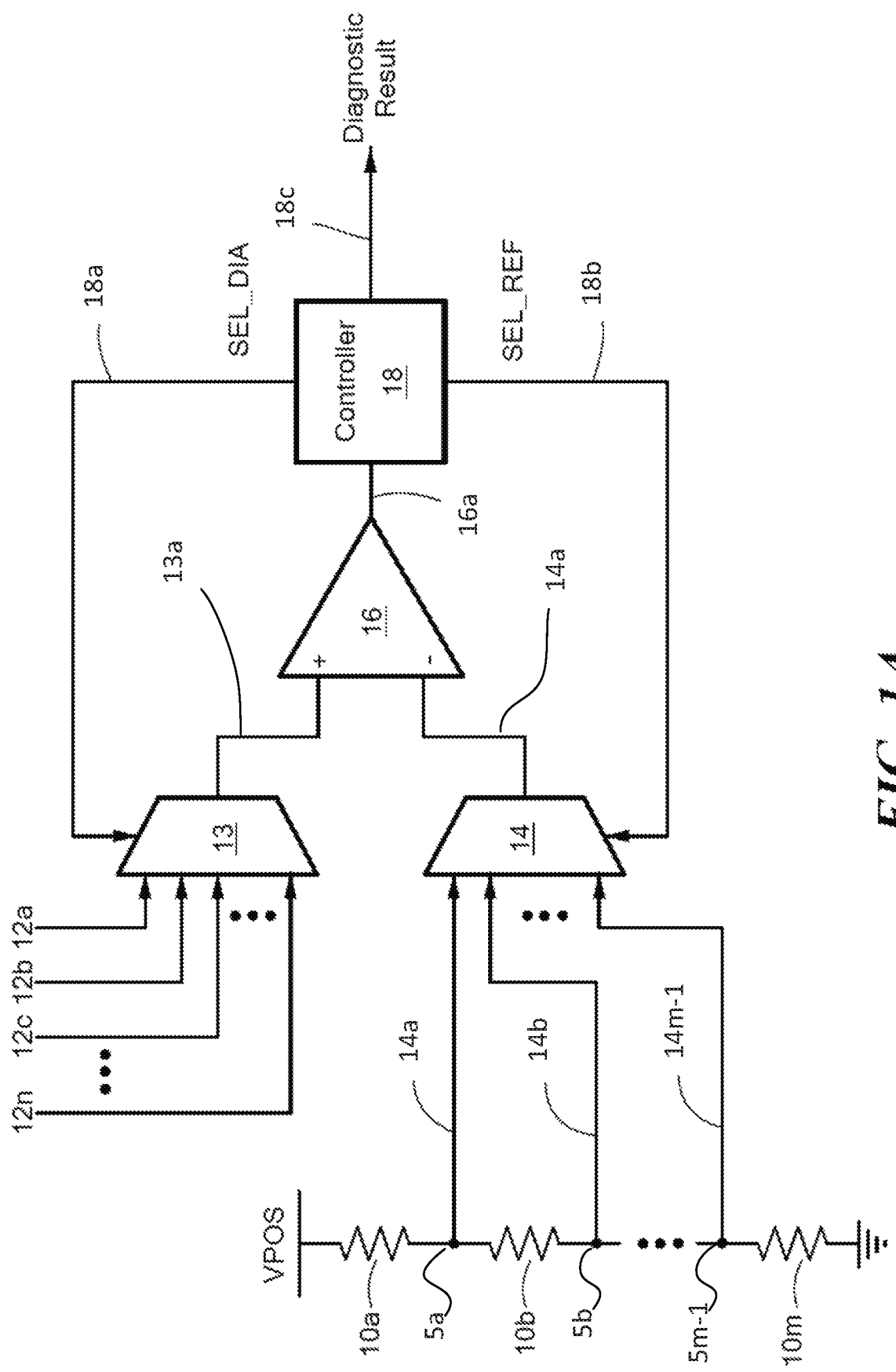
FIG. 1A is a block diagram of a diagnostic test circuit according to described embodiments.

Referring to FIG. 1A, a simplified block diagram of a diagnostic test circuit according to described embodiments is shown. Diagnostic signals $12a$, $12b$, ... $12n$ represent n signals from a device under test (DUT) (not shown). Diagnostic signals can include a variety of types of analog signals including, for example, bias voltages, bandgap voltages, charge pump voltages, hall plate voltages, and signals from sensors of temperature, speed, direction, and magnetic fields, etc.

In embodiments, the diagnostic test circuit and DUT are integrated together (see, e.g., FIG. 4 and accompanying description) and, in some embodiments, represent modular devices that can be disconnected/reconnected. Diagnostic signals $12a$, $12b$, ... $12n$ from the DUT (which can emanate from multiple input signal paths) are transmitted to a multiplexor 13, one of which is selected for transmission through a single output line/path $13a$ by a selection signal $18a$ SEL-DIA sent from a controller 18. A corresponding reference signal is selected at multiplexor 14 among one of $14a$, $14b$, ... $14m$-1 reference signals by a selection signal SEL REF $18b$ sent from controller 18. Reference signals $14a$, $14b$, ... , $14m$-1 emanate from a series of reference voltage nodes $5a$, $5b$, ... , $5m$-1 along a resistor string of resistors $10a$, $10b$, ... , $10m$. The diagnostic signal $13a$ and reference signal $14a$ are compared by a comparator 16, the output of which is transmitted to controller 18. A diagnostic result signal 18c is then output from controller 18.

In embodiments, comparator 16 can be configured to output a signal 16a representing which of the selected diagnostic or reference signals 13a and 14a, respectively, is greater or represent the difference between them. In embodiments, the diagnostic result 18c can be based on, for example, whether the selected diagnostic signal 13a is less, greater, and/or within a predetermined threshold of the selected reference signal 14a. In embodiments, the controller 18 is configured to test a particular diagnostic signal 12a, 12b, . . . , 12n with multiple reference signals prior to generating a positive (e.g., safe) diagnostic result 18c. In embodiments, controller 18 is arranged and configured to test a selected diagnostic signal 13a with multiple reference signals (e.g., minimum and maximum thresholds) and subsequently transmit a negative or positive diagnostic test result 18c based on the results of those tests.

Figure 2:
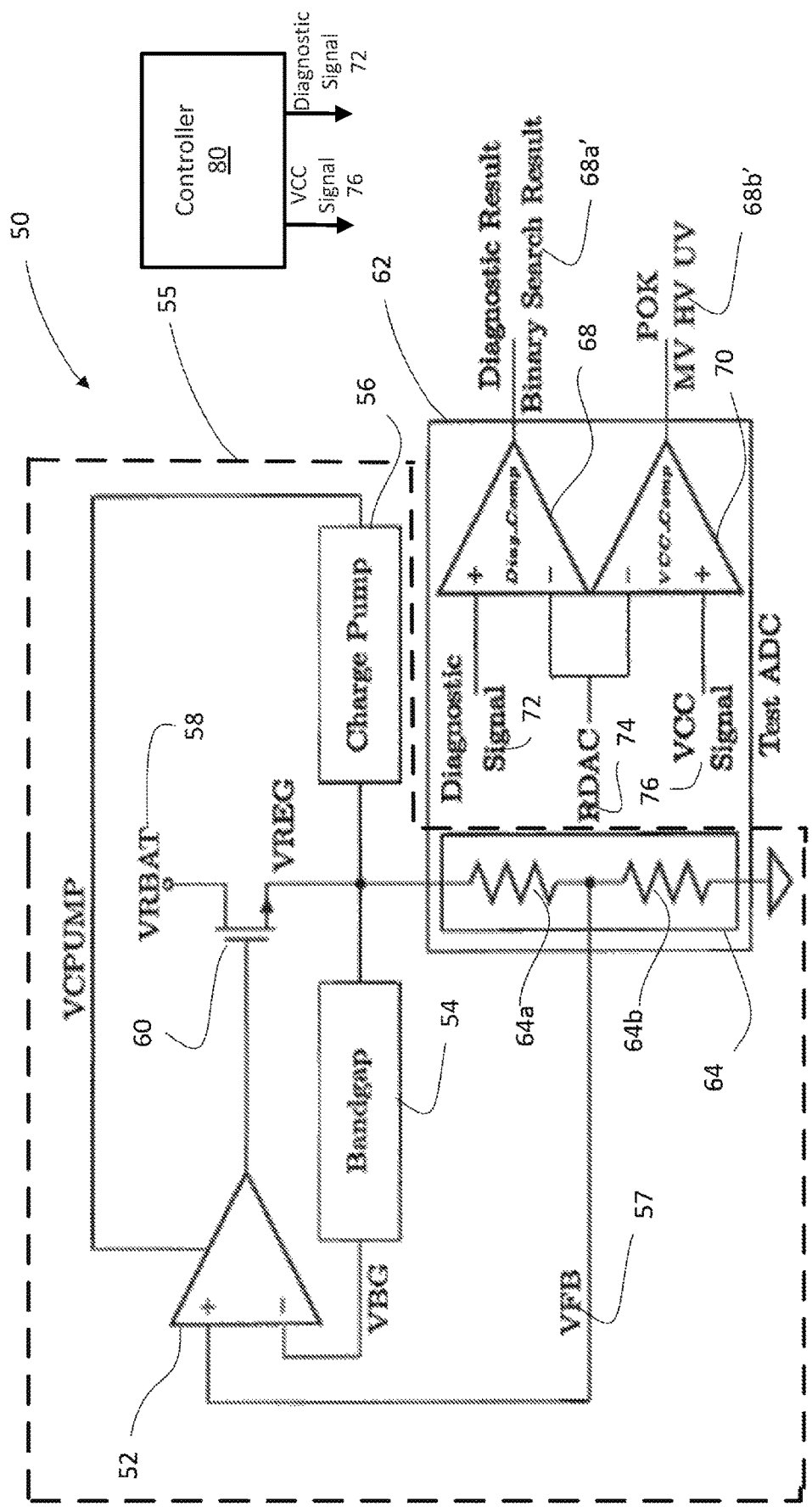
FIG. 2 is a block diagram of a diagnostic test circuit according to described embodiments.

Referring to FIG. 2, a block diagram of a diagnostic test circuit 50 according to described embodiments is shown. In an embodiment, reference voltage RDAC 74 is supplied by reference circuit 55 including a regulated voltage supply with a resistor string 64 of resistors 64a, 64b, . . . (e.g., similar to resistors 10a, 10b, 10m of FIG. 1). A Bandgap 52 provides a fixed voltage to differential amplifier 52. A Charge Pump 56 is utilized to amplify, with differential amplifier 52, the difference between a feedback signal 57 and bandgap voltage from Bandgap 54. The feedback voltage 57 is supplied from the resistor string 64. Power is supplied to the test circuit 50 by a battery 58 which is connected to a MOSFET 60, which is gated by the output of differential amplifier 52 so that a regulated power output is maintained to the resistor string 64, so that RDAC provides predetermined voltages to comparators Diag_Comp 68 and VCC_Comp 70.

In an embodiment, the test circuit 50 is configured to test the integrity of a voltage supply VCC signal 76 and diagnostic signal 72 utilizing a reference signal RDAC 74 from resistor string 64. Comparator VCC_Comp 70 is utilized to test VCC signal 76, which outputs a Power OK (POK) signal 68b' comparing VCC signal 76 to a reference power signal from RDAC 74, in order to verify that proper power to the test circuit 50. Diag_Comp 68 is utilized to compare test diagnostic signal 72 with a reference signal 74 from resistor string 64 and output a diagnostic result 68a'. In an embodiment, diagnostic signal 72, reference voltage RDAC 74, and VCC signal 76 can be selected such as by a controller 80, utilizing a plurality of multiplexors and control signals in accordance with described embodiments.

Figure 3:
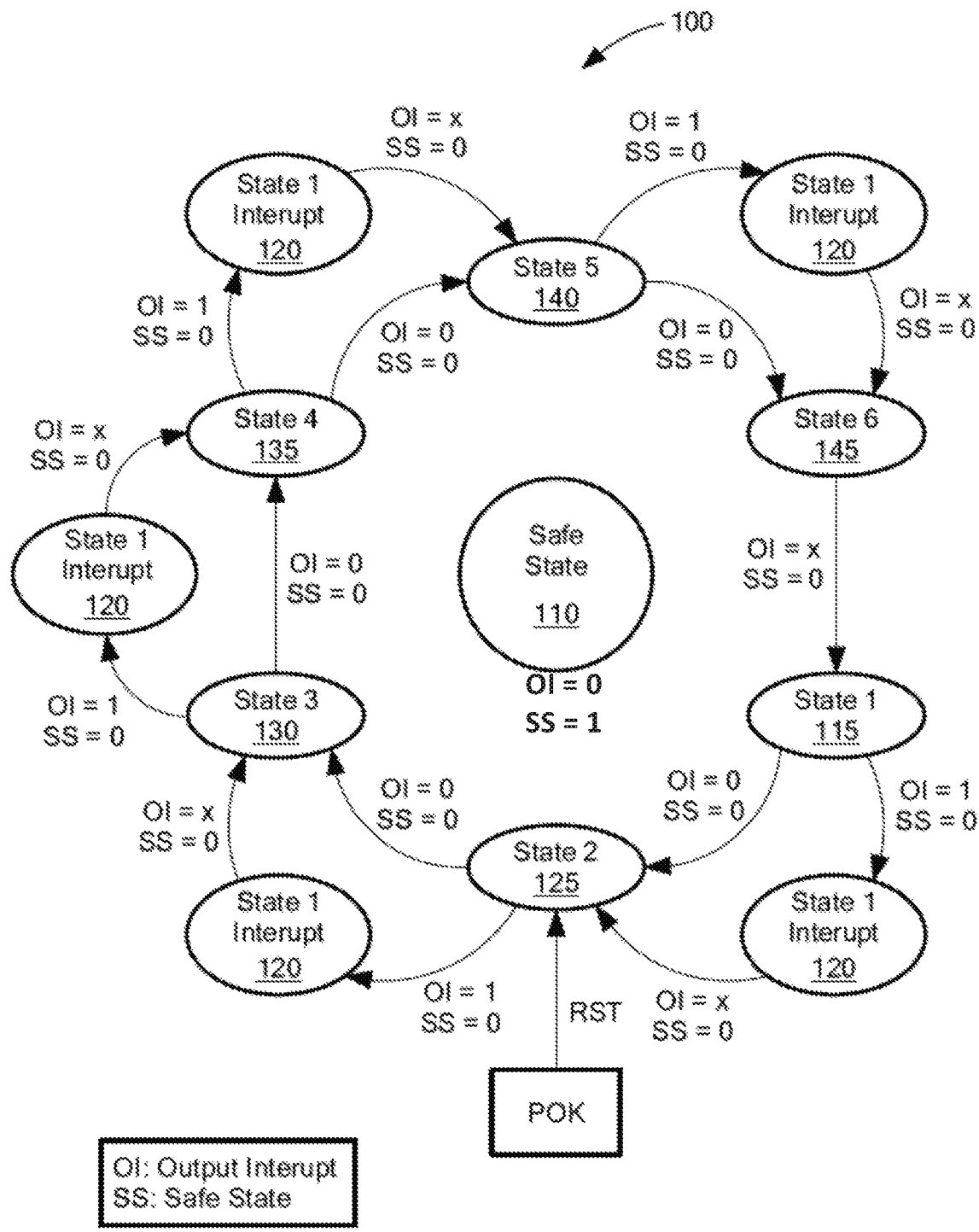
FIG. 3 is a state diagram of a diagnostic test circuit according to described embodiments.

Referring to FIG. 3, a state diagram of a diagnostic test circuit (e.g., a diagnostic test circuit which may be the same as or similar to diagnostic test circuit 50 shown in FIG. 2) according to described embodiments is shown. The state diagram represents a cycle of diagnostic tests performed such as, for example, to verify the operational safety of a DUT.

After a power verification test (POK) is performed, the diagnostic test circuit initializes by setting an Output Interrupt (OI) flag to 0 and a Safe State (SS) flag to 0.

It should be appreciated that in the example embodiment of FIG. 3, a repeating cycle of tests is performed, where the circuit first transitions to a State 2 (125), and a diagnostic test corresponding to State 2 is performed. The circuit subsequently cycles through States 3 (130), 4 (135), 5 (140), and 6 (145), where tests associated with each of those states is performed, before the circuit returns to State 2 and the cycle of States and corresponding tests are repeated.

In an embodiment, during State 2 and during each of the subsequent States 3 (130), 4 (135), 5 (140), and 6 (145), in response to an interrupt being issued (i.e. a signal emitted by hardware or software indicating the existence of an event that requires immediate attention), the diagnostic circuit transitions into a particular state in which an interrupt procedure is executed. In the example of FIG. 3, in response to an interrupt (here denoted as OI=1), the diagnostic circuit transitions into State 1 (120) and a procedure is performed (i.e., executed). In embodiments, State 1 tests the integrity of one or more outputs from the diagnostic test circuit. In an embodiment, testing the circuit output includes testing a high current pulse followed by a low current pulse.

In an embodiment, in order to complete all of the state tests within a fault tolerant time period, a test associated with each of the States 1, 2, . . . 6, will finish even if an interrupt is called during the test. When the system determines that one of the tests fails, the system places itself in a Safe State 110 (SS=1), which can trigger numerous further safety operations such as, for example, notifying an operator of the failure by way of an indicator or other display and/or disabling particular features of the system until the system is no longer in Safe State 110.

If the circuit achieves State 6 (145) without faulting, the circuit proceeds to State 1 (115) and then repeats and cycles again through States 2 (125), 3 (130), etc. It can be appreciated, of course, that any number of tests (States) can be processed depending on the requirements of the system.

Figure 4:
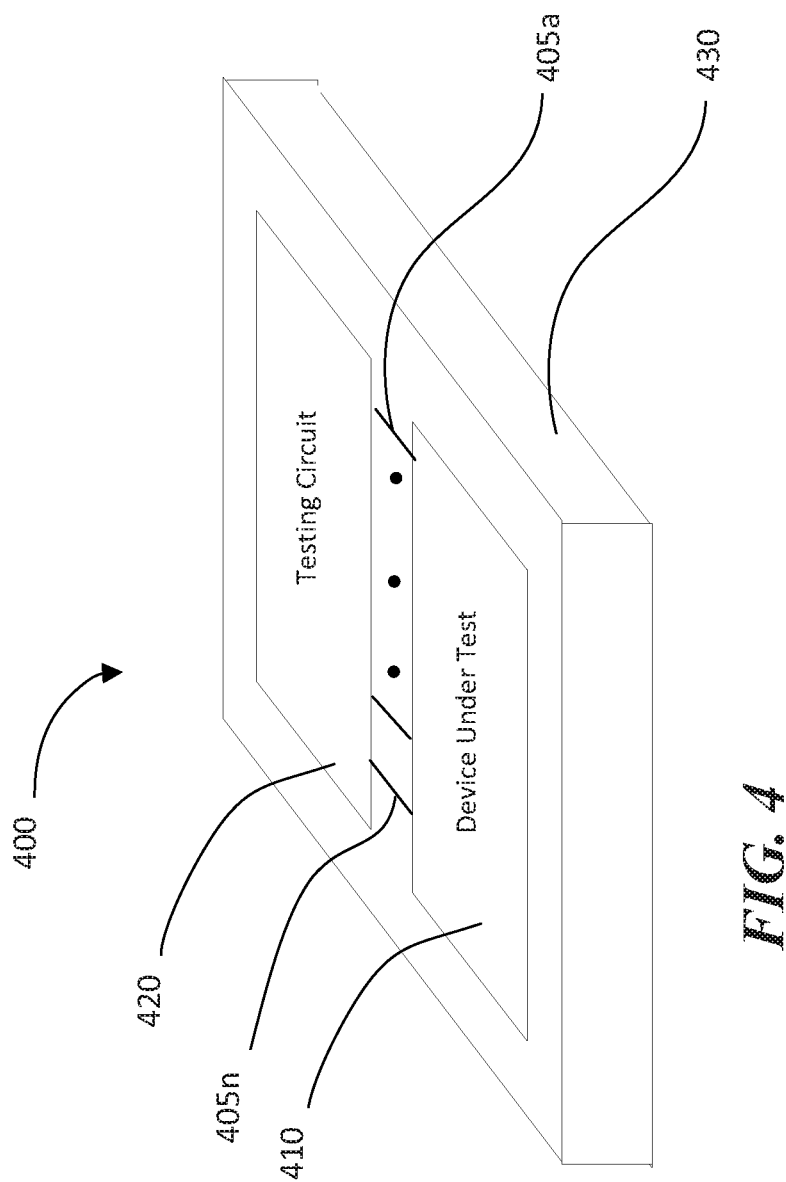
FIG. 4 is an illustrative block diagram of an integrated circuit having a diagnostic test circuit integrated with a device under test (DUT) according to described embodiments.

Referring to FIG. 4, an illustrative block diagram of an integrated circuit 400 including a diagnostic test circuit 420 integrated with a device under test (DUT) 410 is provided according to described embodiments. The diagnostic test circuit 420 and DUT 410 are embedded on a circuit board 430 and are connected via I/O lines 405a, 405b, . . . , 405n which can carry signals including, for example, those described in reference to FIGS. 1A and 2.

Figure 4A:
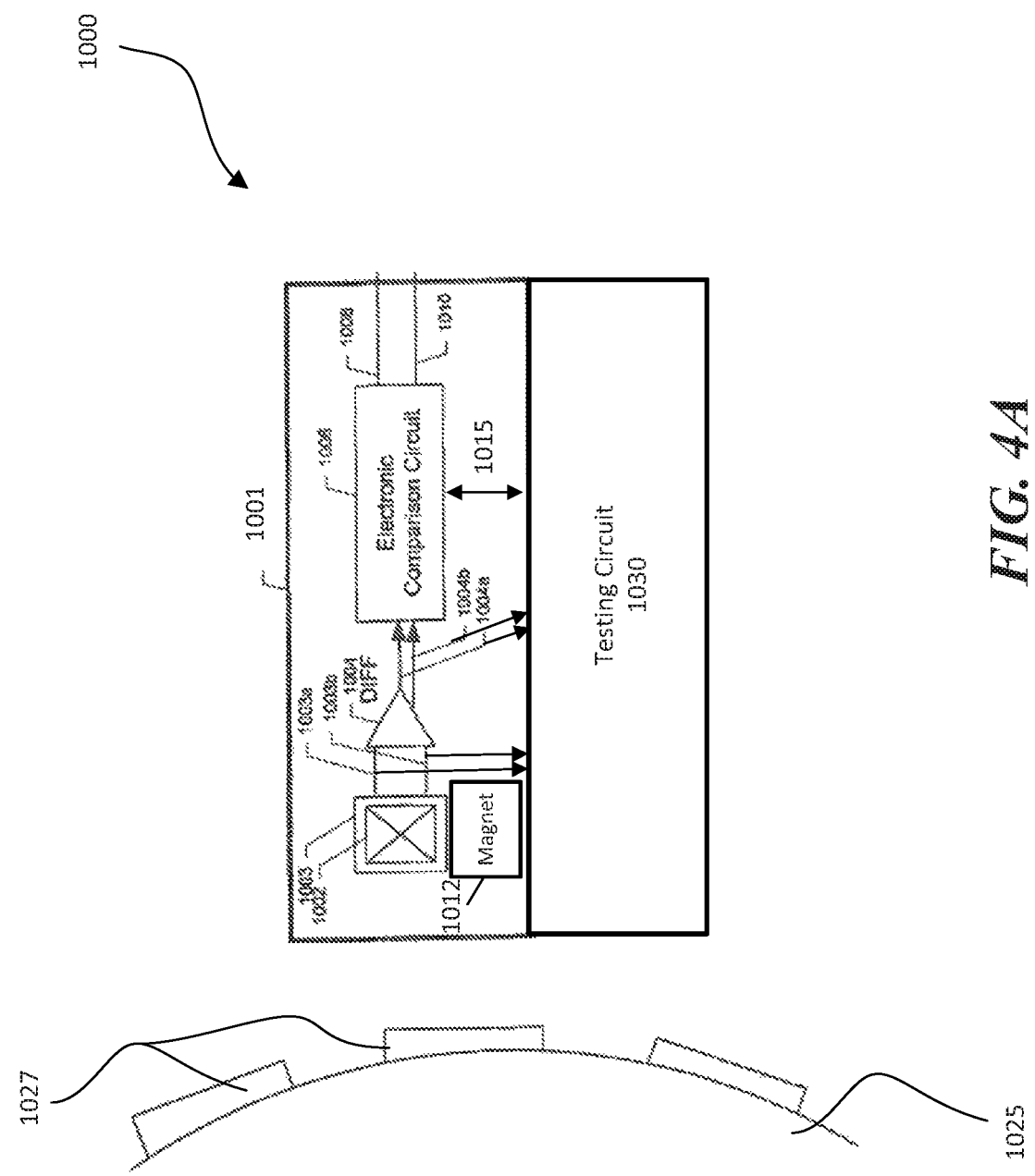
FIG. 4A is an illustrative block diagram of an integrated circuit having a diagnostic test circuit integrated with a magnetic field sensor according to described embodiments.

FIG. 4A is an illustrative block diagram of an integrated circuit 1000 having a diagnostic test circuit 1030 integrated with a magnetic field sensor 1001. A magnetic field sensor 1001 can be responsive to a ferromagnetic object, for example, passing teeth 1027 of a ferromagnetic gear 1025. The magnetic field sensor 1001 can include one or more magnetic field sensing elements, here shown to be a Hall effect element 1002.

A switching network 1003 can be coupled to the Hall element 1002, and can provide current spinning, or chopping, of the Hall element 1002. Current spinning is a known technique in which couplings to a Hall element 1002 are sequentially changed in order to result in a lower DC offset voltage from the Hall element 1002. In an embodiment, a differential output signal 1003a, 1003b can result from current spinning. The differential output signal 1003a, 1003b is a magnetic field signal responsive to a magnetic field. These signals are distributed to and tested by testing circuit 1030 such as according to described embodiments.

A magnet 1012 can be disposed within the magnetic field sensor 1001 and/or proximate to the Hall effect element 1002. Passing gear teeth 1027 cause a magnetic field experienced by the Hall element 1002 to fluctuate, and thus, the differential magnetic field signal 1003a, 1003b has an AC component as the gear rotates. In embodiments, the AC components can be utilized for measuring the direction and speed of rotating teeth 1027 such as described in, for example, U.S. Pat. No. 8,058,864, entitled "Circuits and methods for providing a magnetic field sensor with an adaptable threshold," the entire contents of which is herein incorporated by reference. In an embodiment, the AC components are distributed to and tested by testing circuit 1030 such as in accordance to embodiments described herein.

In embodiments, the magnetic field sensor is a linear magnetic field sensor. In embodiments, the magnetic field sensor can include a magnetoresistive (MR) sensing element such as, for example, an Anisotropic MR (AMR), Giant MR (GMR), or Tunnel MR (TMR) sensing element. One of ordinary skill in the art can, of course, appreciate the use of other types of known magnetic field sensors.

A differential amplifier 1004 can be coupled to receive the differential signal 1003a, 1003b and configured to generate a differential amplified signal 1004a, 1004b. An electronic comparison circuit 1006, which can include a controller, can be configured to deliver control signals (e.g., for testing of particular analog signals as described) to circuit 1030 and can be coupled to receive a differential amplified signal 1004a, 1004b. The comparison circuit 1006 and testing circuit 1030 can communicate (e.g., control signals or fault state signals) through a communications link 1015 and configured to generate at least two binary, two-state, output signals 1008, 1010. These output signals can represent the result of the comparison of signals 1004a and 1004b and/or represent a fault state if a test conducted by testing circuit 1030 fails.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. There are different types of Hall effect elements, for example, a planar Hall element, a vertical Hall element, and a Circular Vertical Hall (CVH) element. There are also different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element might be a single element or, alternatively, might include two or more magnetic field sensing elements arranged in various configurations, e.g., a half bridge or full (Wheatstone) bridge. Depending on the device type and other application requirements, the magnetic field sensing element might be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back bias or other magnet, and a magnetic field sensor that senses a magnetic field density of a magnetic field.

The processes described herein are not limited to the specific examples described. For example, the processes of FIG. 3 are not limited to the specific states or processing order illustrated. Rather, any of the processing states may be re-ordered, combined or removed, performed in parallel or in serial, as necessary, to achieve the results set forth above.

Elements of different embodiments described herein may be combined to form other embodiments not specifically set forth above. Other embodiments not specifically described herein are also within the scope of the following claims.

Reference herein to "one embodiment" or "an embodiment" means that a particular feature, structure, or characteristic described in connection with the embodiment can be included in at least one embodiment of the claimed subject matter. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the words "exemplary" and "illustrative" are used herein to mean serving as an example, instance, or illustration. Any aspect or design described herein as "exemplary" or "illustrative" is not necessarily to be construed as preferred or advantageous over other aspects or designs. Rather, use of the words "exemplary" and "illustrative" is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing the embodiments and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports may be referred to by the same name and are interchangeable for purposes here.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts that have been described and illustrated herein might be made by those skilled in the art without departing from the scope of the following claims.

We claim:

1. An integrated circuit comprising:
   a reference circuit configured to provide a plurality of reference signals;
   a first circuit having a first plurality of inputs configured (a) to receive a corresponding second plurality of diagnostic signals from circuitry under test, and (b) in response to a first control signal provided thereto, to provide at an output thereof a selected one of the diagnostic signals;
   a second circuit having a third plurality of inputs configured (a) to receive a corresponding fourth plurality of reference signals from said reference circuit, and (b) in response to a second control signal provided thereto, to provide at an output thereof a selected one of the plurality of reference signals; and
   a comparator having a first input coupled to the output of said first circuit and having a second input coupled to the output of said second circuit such that in response to diagnostic and reference signals provided thereto from said first and second circuits, said comparator compares the diagnostic and reference signals and provides a state signal at an output thereof, with the state signal representing a result of the comparison between the diagnostic signal and the reference signal.

2. The integrated circuit of claim 1 wherein the first circuit is configured to receive input signals and forward a selected input signal on a selected input into a single line.

3. The integrated circuit of claim 1 wherein the first circuit is a multiplexor having a plurality of input signal paths and a single output signal path.

4. The integrated circuit of claim 1 wherein the first circuit is provided as a multi-input, single output switch.

5. The integrated circuit of claim 1 wherein the reference circuit is provided having a plurality of nodes with each node having one of the plurality of reference signals provided thereon.

6. The integrated circuit of claim 1 wherein the second circuit is coupled to said reference circuit and configured to receive respective ones of the plurality of reference signals at corresponding inputs thereof from respective ones of a plurality of nodes on the reference circuit, the second circuit configured to selectively output one of the reference signals in response to the second control signal provided thereto.

7. The integrated circuit of claim 1 further comprising a controller connected to the first and second circuits, the controller configured to:
   a) transmit the first control signal to the first circuit so as to selectively elicit one of the diagnostic signals from the first circuit;
   b) transmit the second control signal to the second circuit so as to selectively elicit one of the reference signals from the second circuit;
   c) receive the result of the comparison between the diagnostic signal and the reference signal; and
   d) output a fault signal if the difference between the diagnostic signal and the reference signal exceeds a predetermined threshold.

8. The integrated circuit of claim 7 wherein the controller is further configured to repeat a) through d) with a series of paired diagnostic and reference signals.

9. The integrated circuit of claim 8 wherein every pair in the series corresponds to a diagnostic test of the circuitry under test.

10. The integrated circuit of claim 9 wherein the diagnostic test of the circuitry under test comprises testing a plurality of pulses of different current from an output of the circuitry under test.

11. The integrated circuit of claim 10 wherein the reference circuit comprises a plurality of resistors separating the plurality of nodes from one another, the resistors configured to provide a different reference voltage level at each of the nodes.

12. The integrated circuit of claim 1 wherein the circuitry under test comprises a magnetic field sensing element and wherein the diagnostic signals from the circuitry under test comprise signals representing magnetic variations sensed by the magnetic field sensing element.

13. The integrated circuit of claim 12 wherein the magnetic field sensing element comprises a Hall element.

14. The integrated circuit of claim 12 wherein the magnetic field sensing element comprises a magnetoresistive (MR) sensing element.

15. The integrated circuit of claim 14 wherein the MR element is at least one of an Anisotropic MR, Giant MR, or Tunnel MR sensing element.

16. The integrated circuit of claim 1 wherein the circuitry under test comprises at least one of a speed sensor, direction sensor, or linear magnetic field sensor.

17. An integrated circuit comprising:
   a first multiplexor configured to receive a plurality of diagnostic signals from circuitry under test, the first multiplexor configured to selectively output one of the plurality of diagnostic signals in response to a first control signal;
   a second multiplexor configured to receive a plurality of reference signals from a respective plurality of nodes on a reference circuit, the second multiplexor configured to selectively output one of the plurality of reference signals in response to a second control signal; and
   a comparator configured to compare the diagnostic signal elicited from the first multiplexor with the reference signal elicited from the second multiplexor, the comparator further configured to output the result of the comparison between the diagnostic signal and the reference signal.

18. The integrated circuit of claim 17 further comprising a controller connected to the first and second multiplexor, the controller configured to:
   a) transmit the first control signal to the first multiplexor so as to selectively elicit one of the diagnostic signals from the first multiplexor;
   b) transmit the second control signal to the second multiplexor so as to selectively elicit one of the reference signals from the second multiplexor;
   c) receive the result of the comparison between the diagnostic signal and the reference signal; and d) output a fault signal if the difference between the diagnostic signal and the reference signal exceeds a predetermined threshold.

19. The integrated circuit of claim 18 wherein the controller is further configured to repeat a) through d) with a series of paired diagnostic and reference signals.

20. The integrated circuit of claim 17 wherein every pair in the series corresponds to a diagnostic test of the circuitry under test.

21. The integrated circuit of claim 20 wherein the diagnostic test of the circuitry under test comprises testing a plurality of pulses of different current from an output of the circuitry under test.

22. The integrated circuit of claim 21 wherein the reference circuit comprises a plurality of resistors separating the plurality of nodes from one another, the resistors configured to provide a different reference voltage level at each of the nodes.

23. An integrated circuit comprising:
reference circuit means for providing, according to a first control signal, a selected one of a plurality of reference analog signals;
diagnostic circuit output means for providing, according to a second control signal, a selected one of a plurality of diagnostic analog signals from circuitry under test;
means for comparing the selected one of said plurality of reference analog signals with the selected one of said plurality of analog diagnostic signals; and
means for providing an output representing the state of the comparison between the plurality of reference signals and the plurality of diagnostic signals.

24. The integrated circuit of claim 23 wherein the reference circuit means comprises a single output line, the diagnostic circuit output means comprises a single output line, and the means for providing an output representing the state of the comparison comprises a single output line.

25. The integrated circuit of claim 23 further comprising means of testing the output representing the state of the comparison.

26. A circuit comprising:
reference circuit means for providing a plurality of analog reference signals;
first selecting means for receiving analog diagnostic signals from circuitry under test and for selecting, a response to a first control signal provided thereto, one of the analog diagnostic signals;
second selecting means, coupled to said reference circuit means, for receiving the plurality of analog reference signals from said reference circuit means and for selecting, in response to a second control signal provided thereto, one of the plurality of analog reference signals; and
comparing means, coupled to the said first selecting means and said second selecting means, said comparing means for comparing the selected one of the analog diagnostic signals with the selected one of the plurality of analog reference signals, and for providing a comparison state signal at an output thereof.

* * * * *

UNITED STATES PATENT AND TRADEMARK OFFICE
CERTIFICATE OF CORRECTION

PATENT NO. : 10,551,439 B2
APPLICATION NO. : 15/657324
DATED : February 4, 2020
INVENTOR(S) : Mathew Drouin et al.

It is certified that error appears in the above-identified patent and that said Letters Patent is hereby corrected as shown below:

In the Specification

Column 1, Line 7, delete "IC" and replace with --integrated circuit (IC)--.

Column 2, Line 55, delete "The integrated circuit of claim 1 wherein" and replace with --In an embodiment,--.

Column 2, Line 61, delete "(DUT), the first" and replace with --the first--.

Column 3, Line 46, delete "the selected any one" and replace with --the selected one--.

Column 3, Line 50, delete "the selected any one" and replace with --the selected one--.

Column 4, Line 23, delete "bock" and replace with --block--.

Column 4, Line 49, delete "hall" and replace with --Hall--.

Column 5, Line 31, delete "MOSFET" and replace with --metal oxide semiconductor field effect transistor (MOSFET)--.

Column 5, Line 57, delete "test (POK) is" and replace with --test is--.

Signed and Sealed this
Sixteenth Day of February, 2021

Drew Hirshfeld
*Performing the Functions and Duties of the
Under Secretary of Commerce for Intellectual Property and
Director of the United States Patent and Trademark Office*